United States Patent [19]

Nagashima et al.

[11] Patent Number: 5,101,157
[45] Date of Patent: Mar. 31, 1992

[54] FOURIER TRANSFORMATION IMAGING METHOD

[75] Inventors: Mitsunobu Nagashima, Katsuta; Ryuzaburo Takeda, Mito, both of Japan

[73] Assignees: Hitachi, Ltd., Tokyo; Hitachi Instrument Eng. Co., Ibaraki, both of Japan

[21] Appl. No.: 490,304

[22] Filed: Mar. 8, 1990

[30] Foreign Application Priority Data

Mar. 15, 1989 [JP] Japan ................................ 1-63360

[51] Int. Cl.$^5$ ............................................. G01R 33/20
[52] U.S. Cl. ................................................... 324/309
[58] Field of Search ............... 324/300, 307, 309, 318, 324/322, 310, 311, 312, 313, 314; 128/653 A, 653 R

[56] References Cited

U.S. PATENT DOCUMENTS

| 4,649,345 | 3/1987 | Yoda et al. | 324/309 |
| 4,654,594 | 3/1987 | Sepponen | 324/309 |
| 4,737,714 | 4/1988 | Hanawa | 324/309 |
| 5,003,264 | 3/1991 | Koizuma et al. | 324/309 |

Primary Examiner—Michael J. Tokar
Attorney, Agent, or Firm—Antonelli, Terry, Stout & Kraus

[57] ABSTRACT

When the center of an object of interest imaged and the center of a display screen or image area deviate from each other, a Fourier transformation imaging method includes (a) a step of representing the amount of deviation of those centers from each other by the amount of deviation in a frequency encoding direction and the amount of deviation in a phase encoding direction, (b) a step of converting each of the amounts of deviation in the frequency and phase encoding directions into a value calculated in terms of the amount of rotation of the phase angle of a measured resonance signal, (c) a step of correcting the amount of rotation of the phase angle of the measured resonance signal on the basis of the values obtained by the conversion, and (d) a step of Fourier-transforming the corrected signal to display an image in which there is no deviation or the center of the object of interest is located at the center of the image area.

7 Claims, 11 Drawing Sheets

IMAGE BEFORE SHIFTING

IMAGE AFTER SHIFTING

P : CENTER OF OBJECT OF INTEREST

C : GRADIENT MAGNETIC FIELD CENTER

M : FIELD OF VIEW FOR RE-IMAGING $l_x$ : SHIFT DISTANCE IN FREQUENCY ENCODING DIRECTION $l_y$ : SHIFT DISTANCE IN PHASE ENCODING DIRECTION

N : NUMBER OF PIXELS (NUMBER OF FOURIER TRANSFORMATION POINTS)

FOURIER TRANSFORMATION IMAGING METHOD

BACKGROUND OF THE INVENTION

The present invention relates to a Fourier transformation imaging method in which a nuclear magnetic resonance (NMR) tomographic image is formed so that an object of interest imaged is located at a central portion of a display screen or image area.

Figure 12:
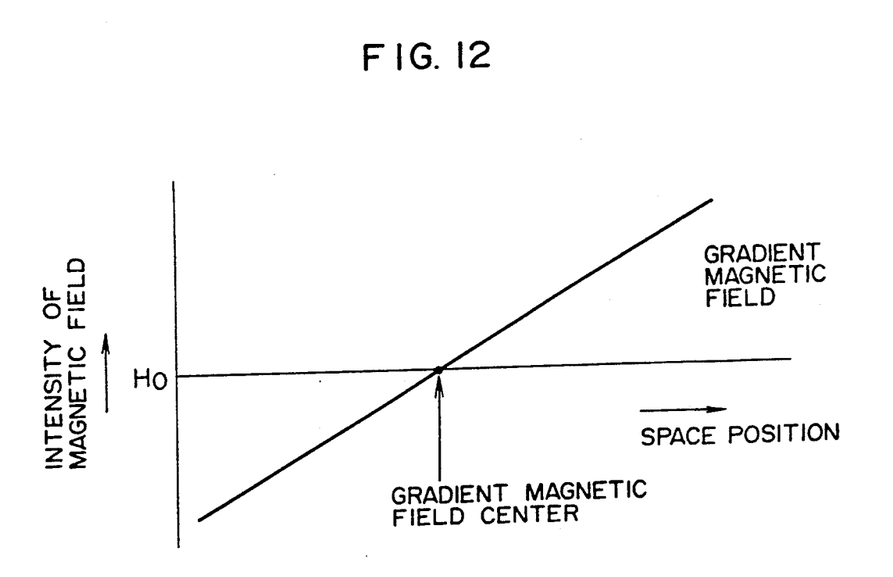
FIG. 12 shows a point which is called a gradient magnetic field center.

A gradient magnetic field is applied in a manner that the intensity of the magnetic field linearly varies from the minus region to the plus region in response to the space position shown in FIG. 12. The intensity $H_0$ of the magnetic field is that of a static magnetic field. The minus and plus regions of the intensity of the magnetic field is separated at line $H_0$. There is a point at which the intensity of the magnetic field does not vary, even though the gradient magnetic field is applied. The point is called a gradient magnetic field center. In a general apparatus for imaging magnetic resonance signals, the gradient magnetic field center is located at the center of a display screen. Accordingly, it is necessary that the object of interest be brought to the gradient magnetic field center, when the center of the object of interest is desired to be imaged at the center of the display screen. In the case where the center of the object of interest is apart from the gradient magnetic field center, the Fourier transformation of a measured resonance signal provides an image area, as defined by a framework 53 shown by solid lines in FIG. 1A or 1B, in which a part of the object 52 of interest outside of a field of view appears on the opposite side of the image area. This phenomenon is called a signal aliasing phenomenon which is caused in accordance with the Nyquist's sampling theorem.

Figure 2:
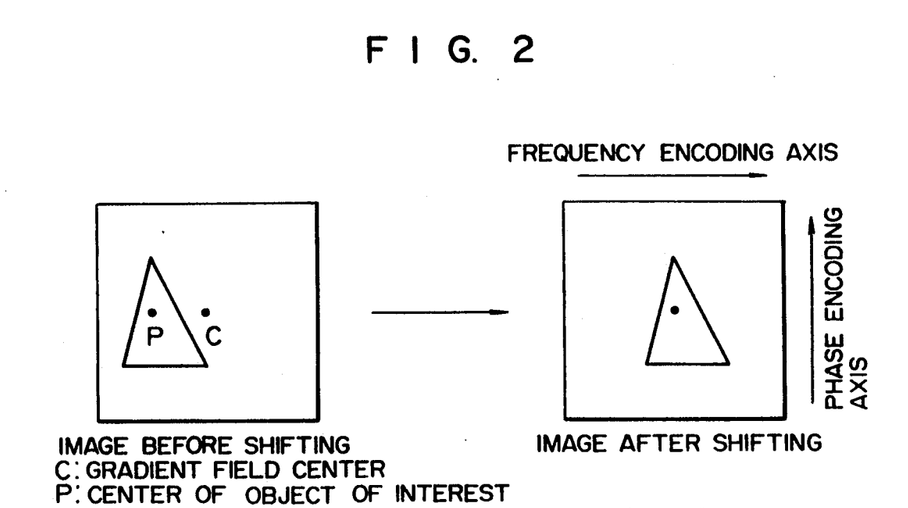
FIG. 2 is a view for explaining a method for shifting a portion of interest to be imaged.

For example, JP-A-60-207045 filed on Mar. 30, 1984 by Shimadzu Seisakusho, Ltd. has proposed a method in which a field of view is shifted in a frequency encoding direction, as shown in FIG. 2, by selecting a reference signal frequency used for detecting a resonant signal by homodyne-detection as a center frequency. The frequency encoding direction is represented by a line which goes through the center of the gradient magnetic field and the center of the object of interest.

The center frequency is a resonant frequency calculated from a distance between the center of the object of interest and the center of the gradient magnetic field and the intensity of the gradient magnetic field for frequency encoding. Since data involving an aliasing phenomenon is obtained if the detection is made with the conventional reference signal $f_0$ and a Fourier transformation is made, the proposed method obtains data free of the aliasing phenomenon by making the detection with $(f_0+\alpha)$ being taken as a reference signal (see FIG. 3). This reference signal is produced by means of hardware. Accordingly, a frequency changeover mechanism for selecting the resonance frequency is newly required.

Also, JP-A-63-160641 filed on Dec. 24, 1986 by Hitachi, Ltd. has proposed a method in which a field of view is shifted in a frequency encoding direction or a phase encoding direction through data scroll which is one of image processing techniques. In this method, shifting with a pitch finer than the resolution in the frequency encoding direction or the phase encoding direction is impossible.

Further, JP-A-63-111848 filed on Oct. 31, 1986 by Toshiba, Ltd. (U.S. Pat. No. 4,772,850) has disclosed a technique in which after image data involving the aliasing of signal has been Fourier-transformed in each of a phase encoding direction and a frequency encoding direction, readout start addresses of the image data in the respective directions are controlled so that an object of interest imaged is displayed at the center of an image area. In this case, too, since the shifting is made after the Fourier transformation, finer shifting cannot be attained.

SUMMARY OF THE INVENTION

Figure 1A:
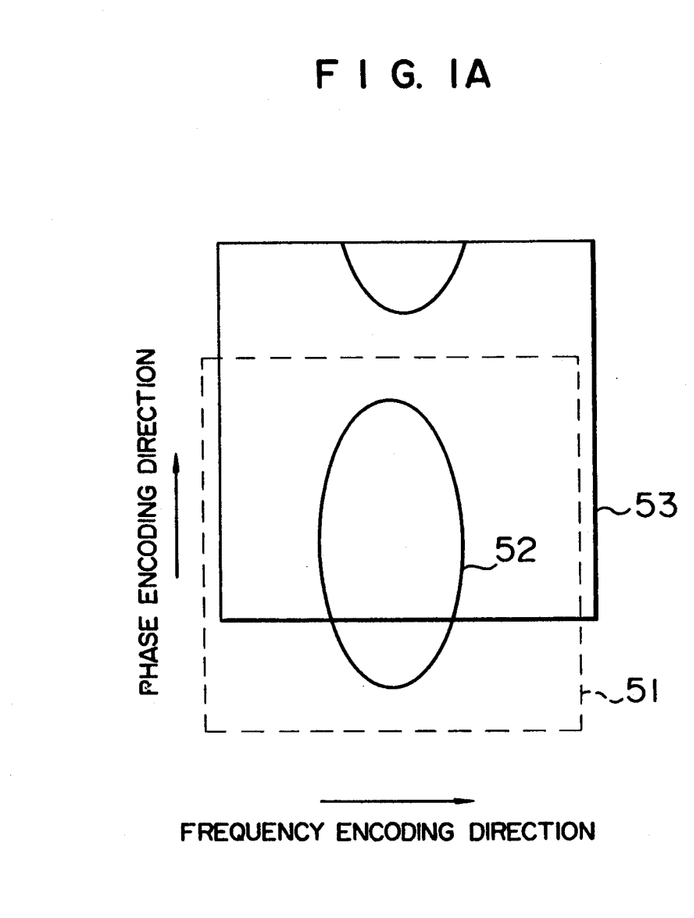
FIGS. 1A and 1B are views for explaining a signal aliasing phenomenon.
Figure 1B:
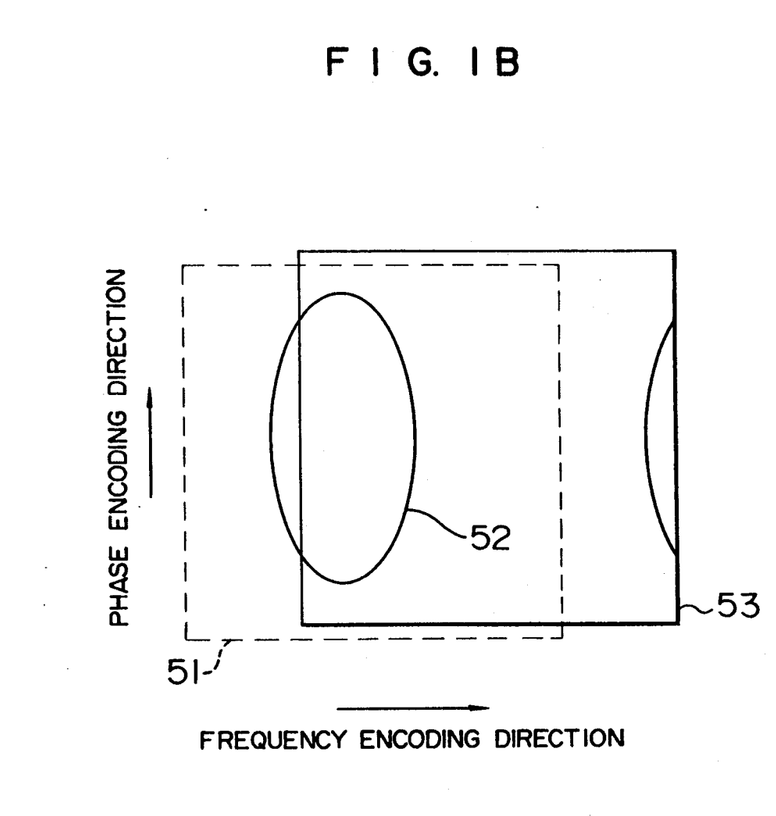
Figure 3:
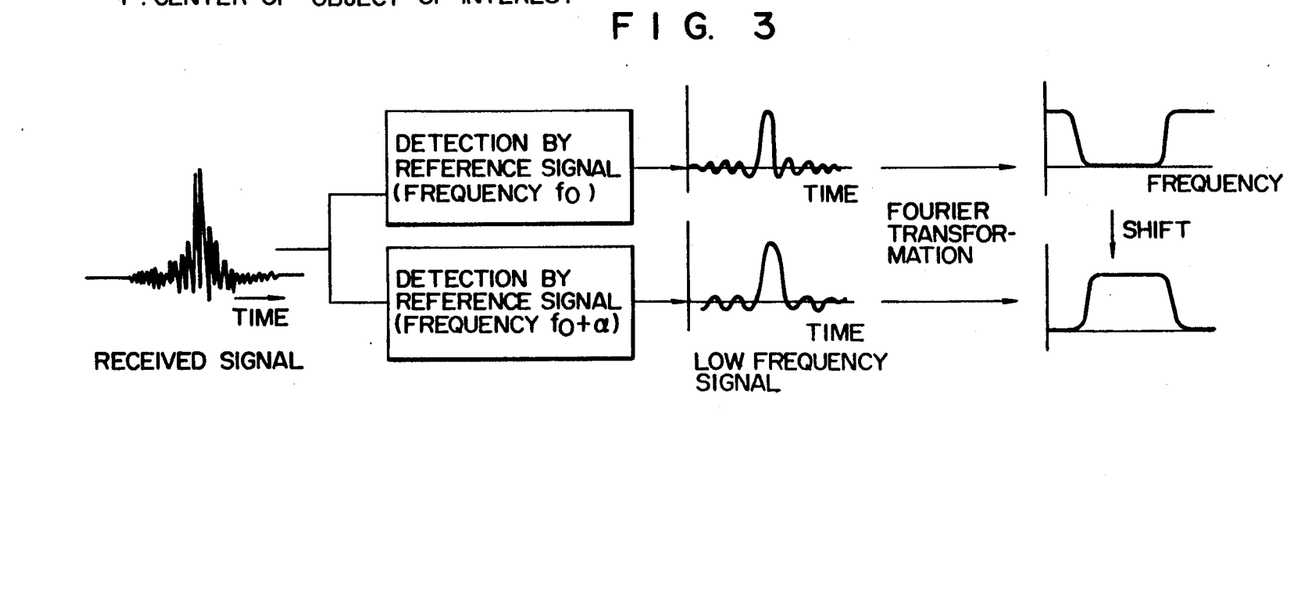
FIG. 3 is a view for explaining a related art.

When the gradient magnetic field center and the center of an object of interest to be imaged substantially coincide with each other, the center of the object 52 of interest is located at a central portion of an image area defined by a framework 51 shown by broken lines in FIG. 1A or 1B. When the gradient magnetic field center and the center of the object of interest greatly deviate from each other, the object 52 of interest is divided in an image area defined by a framework 53 shown by solid lines in FIG. 1A or 1B because of the aliasing of a part of the object 52 of interest. In the above-mentioned references, a detected resonance signal is modulated by a signal generated by means of hardware or an operational processing for shifting an image is performed for data after Fourier transformation, in order to display the center of the object of interest at the central portion of the image area. In the present invention, on the other hand, the phase of a detected resonance signal is modulated through a program processing and the modulated signal is Fourier-transformed, thereby obtaining image data with which the center of the object of interest is located at the center of the image area. A feature of the present invention lies in that the processing corresponding to the detection by the reference signal $(f_0+\alpha)$ in FIG. 3 is performed by the program processing.

Figure 4:
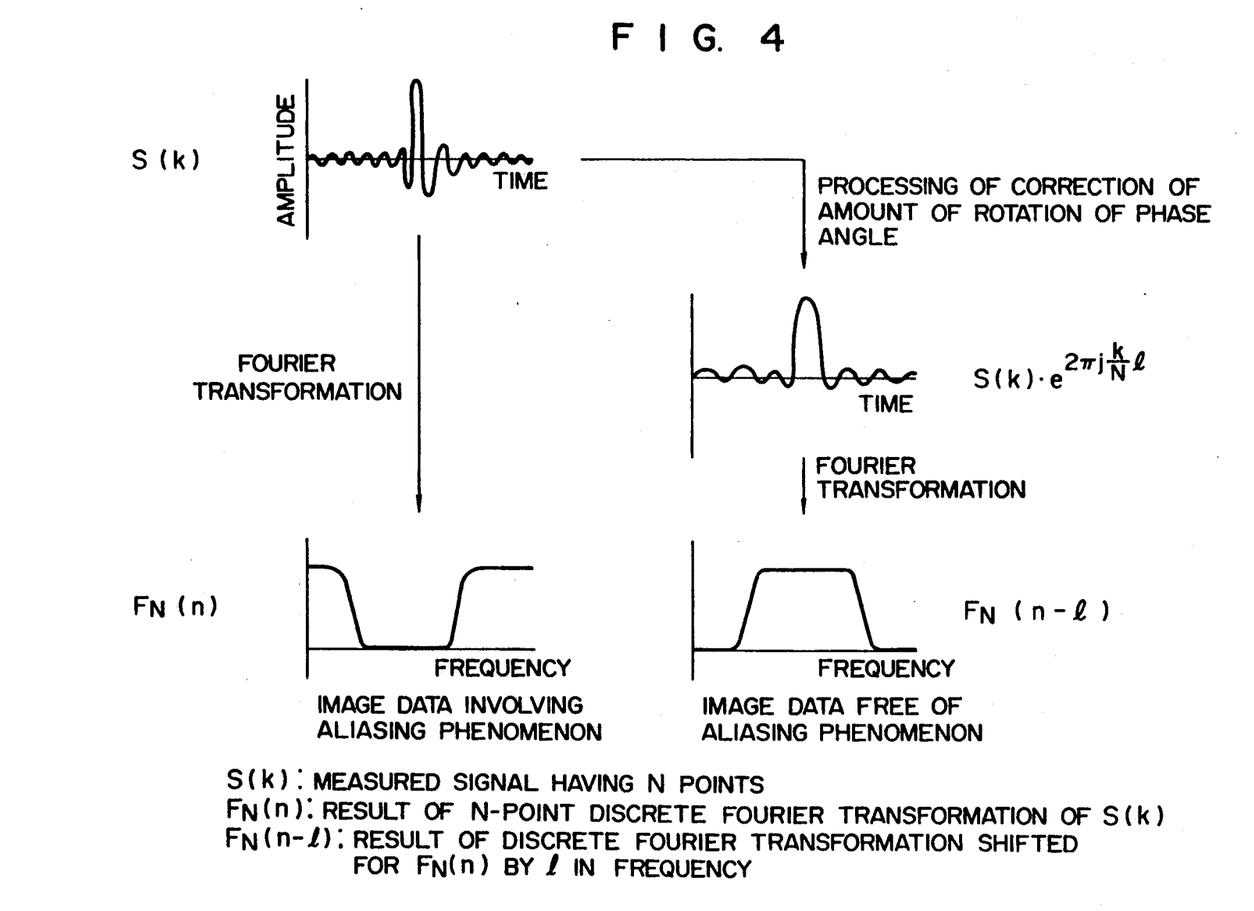
FIG. 4 is a view showing the principle of the present invention.

The object of the present invention is attained by the following steps as follows. Namely, in a first step, a distance by which shifting is to be made is determined from the amounts of deviation of the center of a display screen or image area and the center of an object of interest imaged from each other in a frequency encoding direction and a phase encoding direction. In a second step, each of those amount of deviation is converted into the amount of rotation of the phase angle of a measured resonance signal. In a third step, a processing of correction for the amount of rotation of the phase angle of the resonance signal is performed. In a fourth step, a Fourier transformation is made to obtain image data free of an aliasing phenomenon. The method of the present invention is shown in FIG. 4. In the case where their results in image data involving an aliasing phenomenon when the measured signal is Fourier-transformed as it is, image data free from the aliasing phenomenon can be obtained in a stage before Fourier transformation by subjecting a measured signal to the correction for the amount of rotation of the phase angle of the signal corresponding to the required amount of shift. The amount of correction can be continuously established. Therefore, finer shifting becomes possible.

DESCRIPTION OF THE PREFERRED EMBODIMENTS

Figure 5:
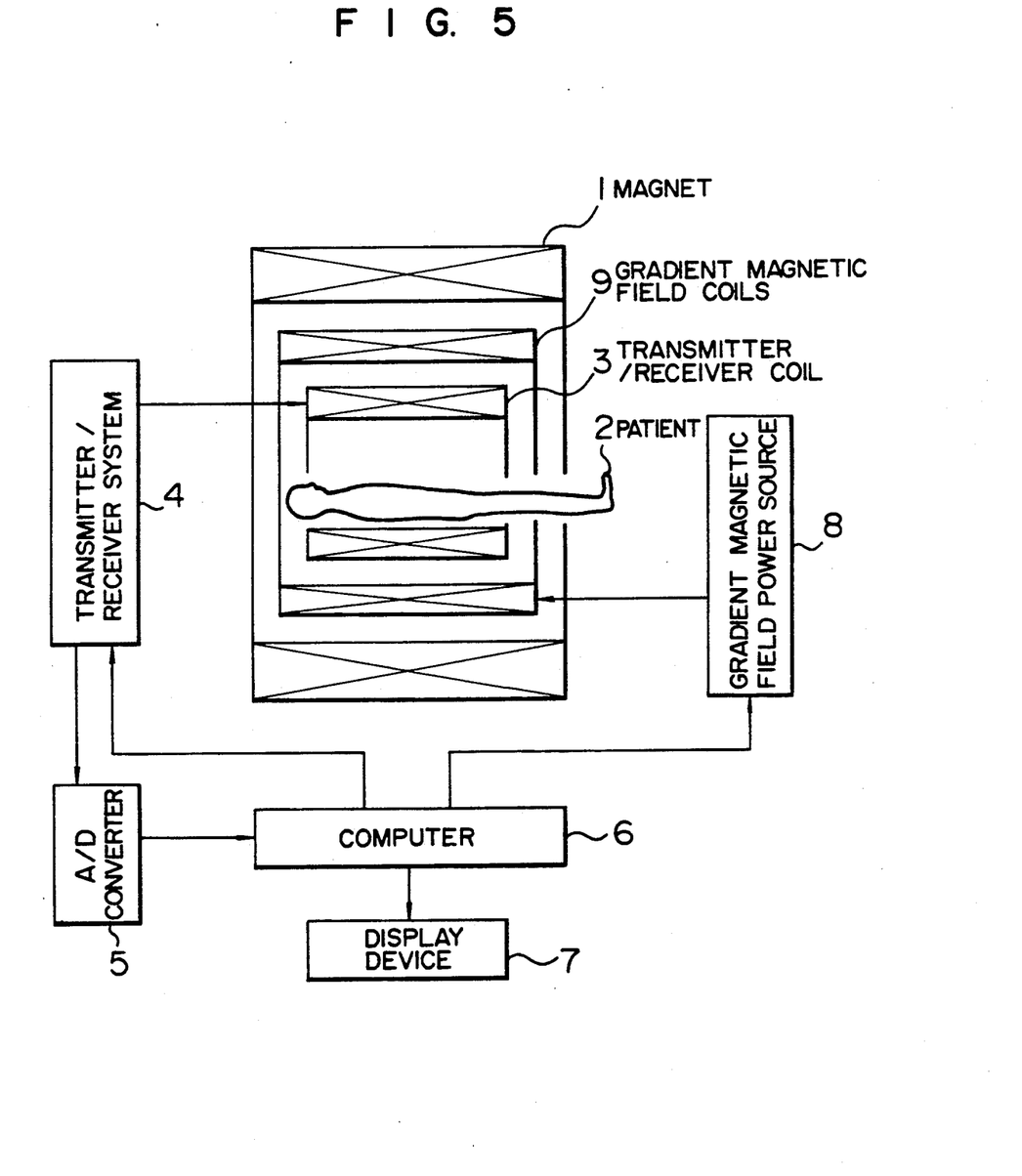
FIG. 5 is a block diagram of a system according to the present invention.

FIG. 5 shows a block diagram of a system according to the present invention. An object to be examined or a patient 2 is located in a magnet 1 for generating a uniform static magnetic field. An RF or high frequency necessary for causing nuclear magnetic resonance of atomic nuclei $^1$H of hydrogen in the patient 2 is generated by a transmitter/receiver system 4 to irradiate the patient 2 with the RF in virtue of a transmitter/receiver coil 3. After the irradiation for a fixed time, a nuclear magnetic resonance signal emitted by the atomic nuclei $^1$H of hydrogen in the patient 2 is detected by the transmitter/receiver coil 3. The detected resonance signal is converted by the transmitter/receiver system 4 into an audio frequency which in turn is converted by an A/D converter 5 into a digital signal. The digital signal is subjected to an image processing in a computer 6 and the result of processing is displayed on a display device 7. Gradient magnetic fields for providing position information necessary for imaging to the signal are applied by gradient magnetic filed coils 9 connected to a gradient magnetic field power source 8 which is controlled by the computer 6 so as to satisfy a predetermined necessary condition, i.e. a pulse sequence. The gradient magnetic fields are generated in x-, y- and z-axis directions of a three-dimensional orthogonal coordinate system, respectively. The computer 6 also controls the transmitter/receiver system 4.

Figure 6:
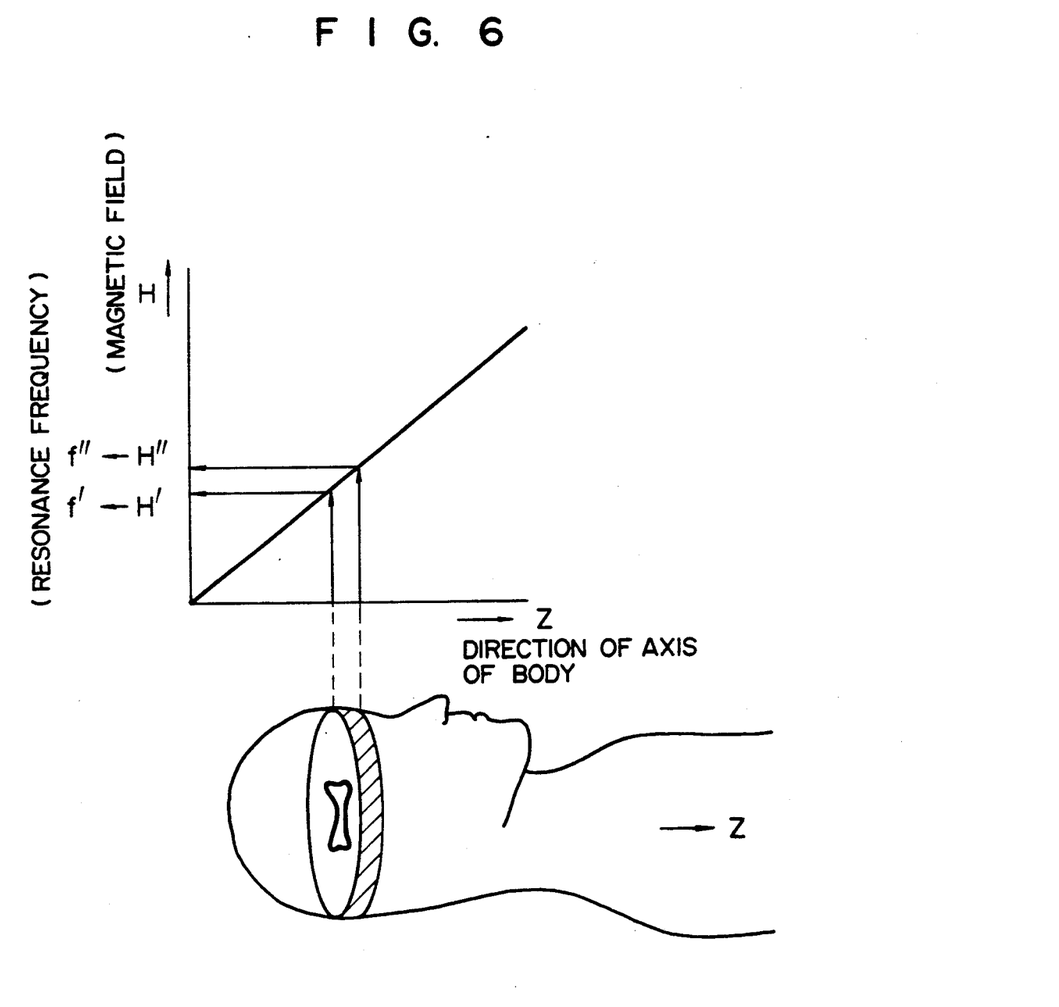
FIG. 6 is a view for explaining the principle of slicing.

FIG. 6 is a view for explaining the principle of slicing. An RF (or high frequency) pulse, which is converted into a rectangular wave having a specified frequency width through Fourier transformation, is applied in a gradient magnetic field oriented to a direction of the axis of the body of a patient and in a direction perpendicular to the gradient magnetic field. Under an interaction with the intensity of the gradient magnetic field, nuclear spins resonate in a resonance frequency which corresponds to the specified frequency width after the Fourier transformation. The resonance frequency is generated on the basis of the equation of $f=\gamma H$, where f is the resonance frequency, $\gamma$ the gyromagnetic ratio, and H the intensity of the gradient magnetic field which atomic nuclei receive. Thereby, a position of the magnetic field intensity corresponding to the specified frequency width is selected as a slice width.

To change the basic frequency of the RF pulse causes a corresponding frequency after the Fourier transformation so that a position to be sliced is correspondingly changed. MRI (magnetic resonance imaging) utilizes this principle.

Figure 7:
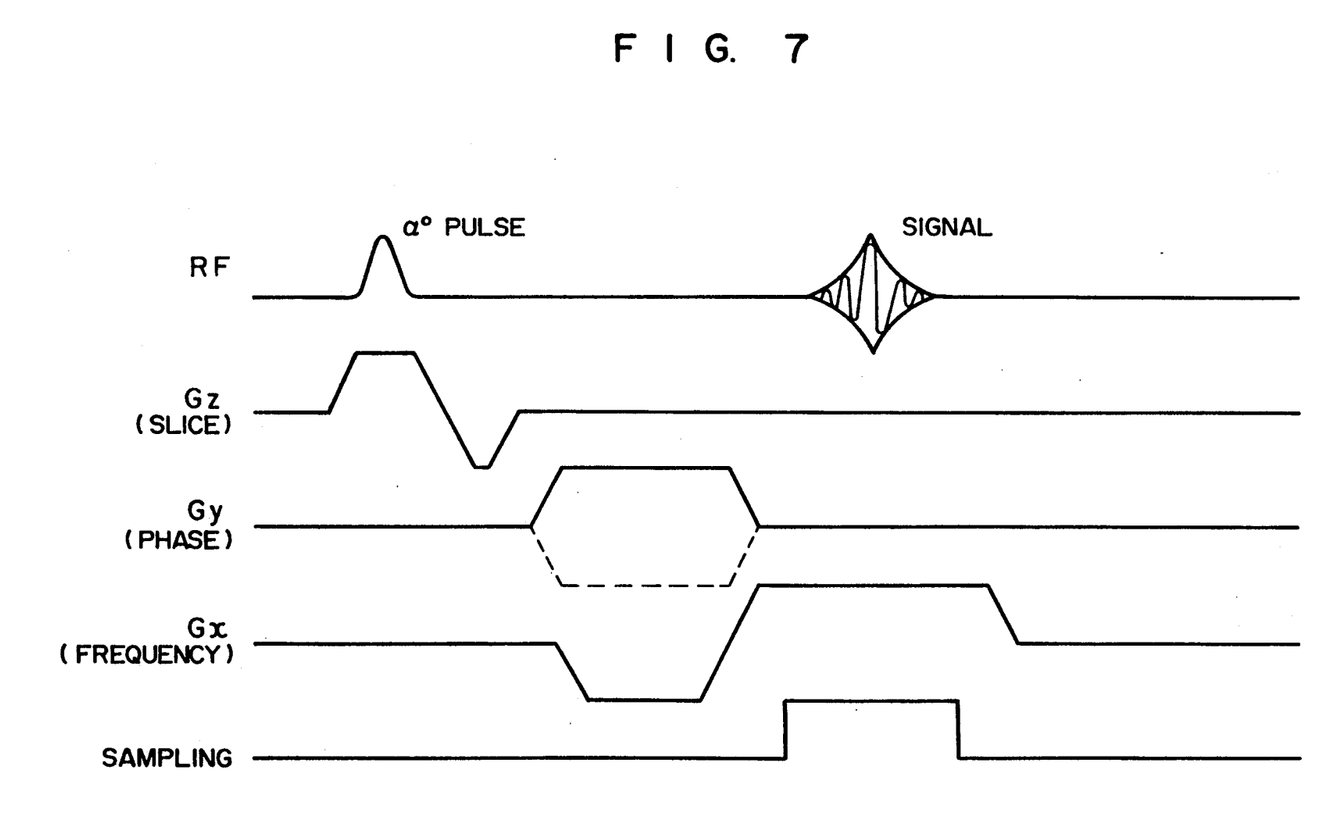
FIG. 7 shows a pulse sequence used in a two-dimensional Fourier transformation imaging method.

FIG. 7 shows a pulse sequence used in a two-dimensional Fourier transformation imaging method. It is assumed that a direction of the axis of the body of a patient coincides with the z-axis direction of a three-dimensional orthogonal coordinate system. An RF pulse causes the spins of atomic nuclei in a selected slice width to tilt by 90° or an angle α° smaller than that. At the same time, a gradient magnetic field $G_Z$ in the z-direction is applied for determining a slice position in the body axis direction. In order to acquire data in a phase encoding direction on a display screen or image area, a gradient magnetic field $G_Y$ in the y-direction is applied with the intensity being successively changed each time a resonance signal is measured. In order to specify a position in a slice plane in the frequency encoding direction, a gradient magnetic field $G_X$ in the x-direction is applied to measure a nuclear magnetic resonance signal by sampling. The resonance signals are received as the data in the computer. A direction of the temporal axis of the resonance signal corresponds to a frequency encoding direction on the image area.

Now consider the case where an object of interest to be imaged is to be displayed in an enlarged form at a central portion of a display screen or image area, when the result of the initial imaging provides an image in which the center P of the object of interest is apart from the gradient magnetic field center C.

Figure 8:
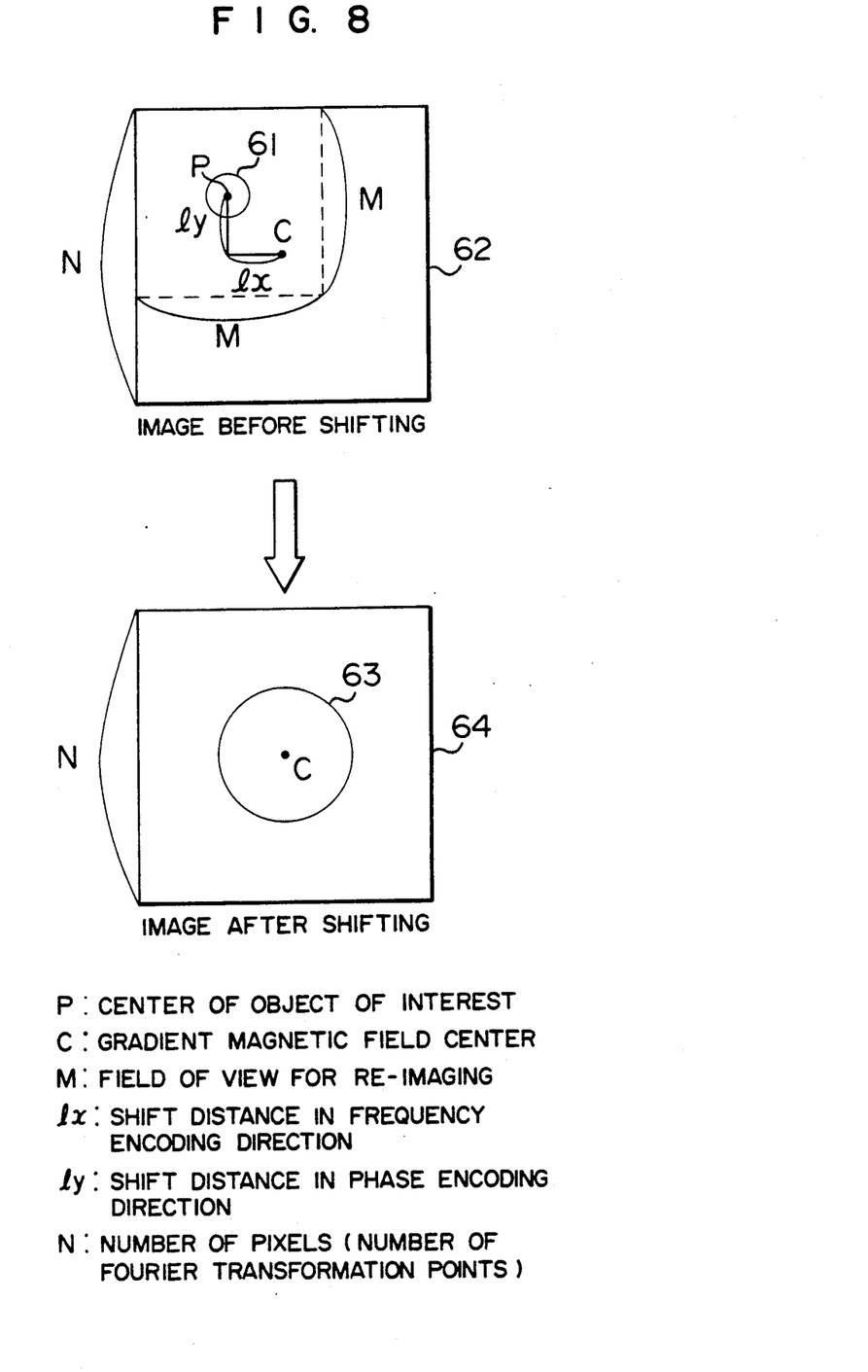
FIG. 8 is a view showing image areas before and after shifting in the present invention.
Figure 9:
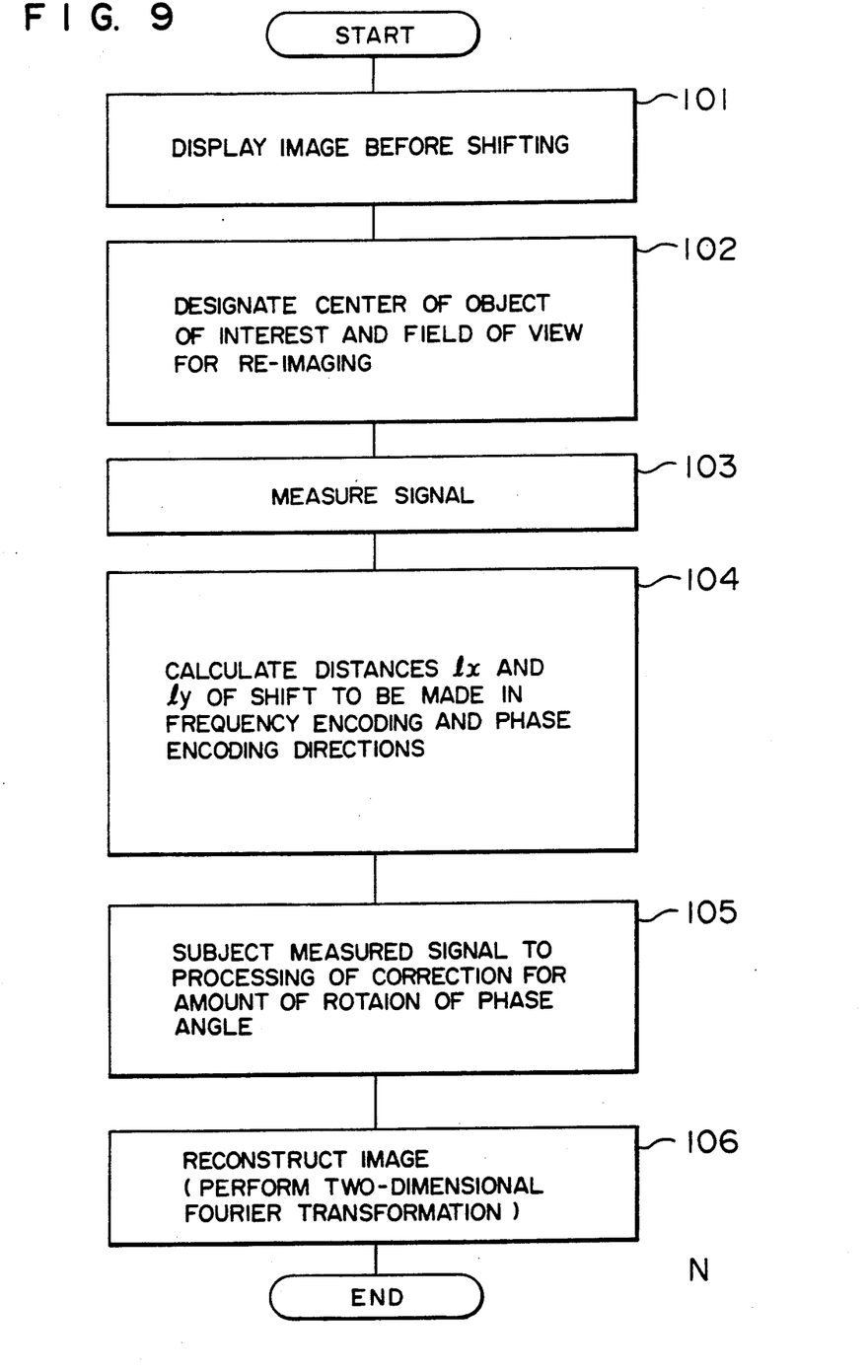
FIG. 9 shows a flow chart of the present invention.

FIG. 9 shows a flow chart of the present invention. Explanation will be made on the basis of FIG. 8. In step 101, an image area 62 before shifting is displayed. In step 102, the center P of the object of interest and a field of view M for re-imaging are designated. In step 103, a resonance signal is measured with a larger sampling interval by using the pulse sequence shown in FIG. 7. The larger sampling interval can provide an image displayed in an enlarged form. In step 104, distances $l_x$ and $l_y$ by which the shifting is to be made in the frequency encoding direction and the phase encoding direction are calculated to determine the amount of correction for the phase angle of the measured signal. In step 105, the measured signal is subjected to a processing of correction for the amount of rotation of the phase angle. In step 106, a two-dimensional Fourier transformation is performed to reconstruct an image.

The phase angle rotation amount correction processing in step 105 will now be explained. The shift distances $l_x$ and $l_y$ in the frequency encoding direction and the phase encoding direction are determined from the image area before shifting, and values $l'_x$ and $l'_y$ used in the phase angle rotation amount correction processing are calculated by use of the following (1):

$$\left. \begin{array}{l} l'_x = (l_x/M) \cdot N \\ l'_y = (l_y/M) \cdot N \end{array} \right\} \quad (1)$$

where M is the field of view (in units of length) of an image area 64 after shifting obtained by re-imaging and N is the number of Fourier transformation points of the image area 64 in the frequency encoding direction or the phase encoding direction. Next, a measured signal S(k, m) is subjected to the phase angle rotation amount correction processing represented by the following equation (2):

$$S'(k, m) = S(k, m) \cdot e^{2\pi j \frac{k}{N} l_x} \cdot e^{2\pi j \frac{m}{N} l_y} \quad (2)$$

where $\pi$ is the ratio of the circumference of a circle to its diameter and $j^2$ is equal to $-1$. A two-dimensional Fourier transformation is performed for $S'(K, m)$ to obtain an image area after shifting.

A two-dimensional discrete Fourier transformation of the measured signal $S(k, m)$ is represented by the following:

$$F_N(x, y) = \sum_{k=1}^{N} \sum_{m=1}^{N} S(k, m) \cdot e^{-2\pi j (\frac{kx}{N} + \frac{my}{N})} \quad (3)$$

Accordingly, from the equations (2) and (3), a two-dimensional discrete Fourier transformation of $S'(k, m)$ is represented by the following equation:

$$\sum_{k=1}^{N} \sum_{m=1}^{N} S'(k, m) \cdot e^{-2\pi j(\frac{kx}{N} + \frac{my}{N})} \quad (4)$$

$$= \sum_{k=1}^{N} \sum_{m=1}^{N} S(k, m) \cdot e^{2\pi j(\frac{k}{N} l_x + \frac{m}{N} l_y)} \cdot e^{-2\pi j(\frac{kx}{N} + \frac{my}{N})}$$

$$= \sum_{k=1}^{N} \sum_{m=1}^{N} S(k, m) \cdot e^{-2\pi j\{\frac{k(x - l_x)}{N} + \frac{m(y - l_y)}{N}\}}$$

$$= F_N(x - l_x, y - l_y).$$

The equation (4) shows that the Fourier transformation of the measured signal subjected to the phase angle rotation amount correction processing in accordance with the present invention results in image data after shifting. In the case where only the shifting in one direction is involved, $l'_x$ or $l'_y$ is 0.

Figure 10:
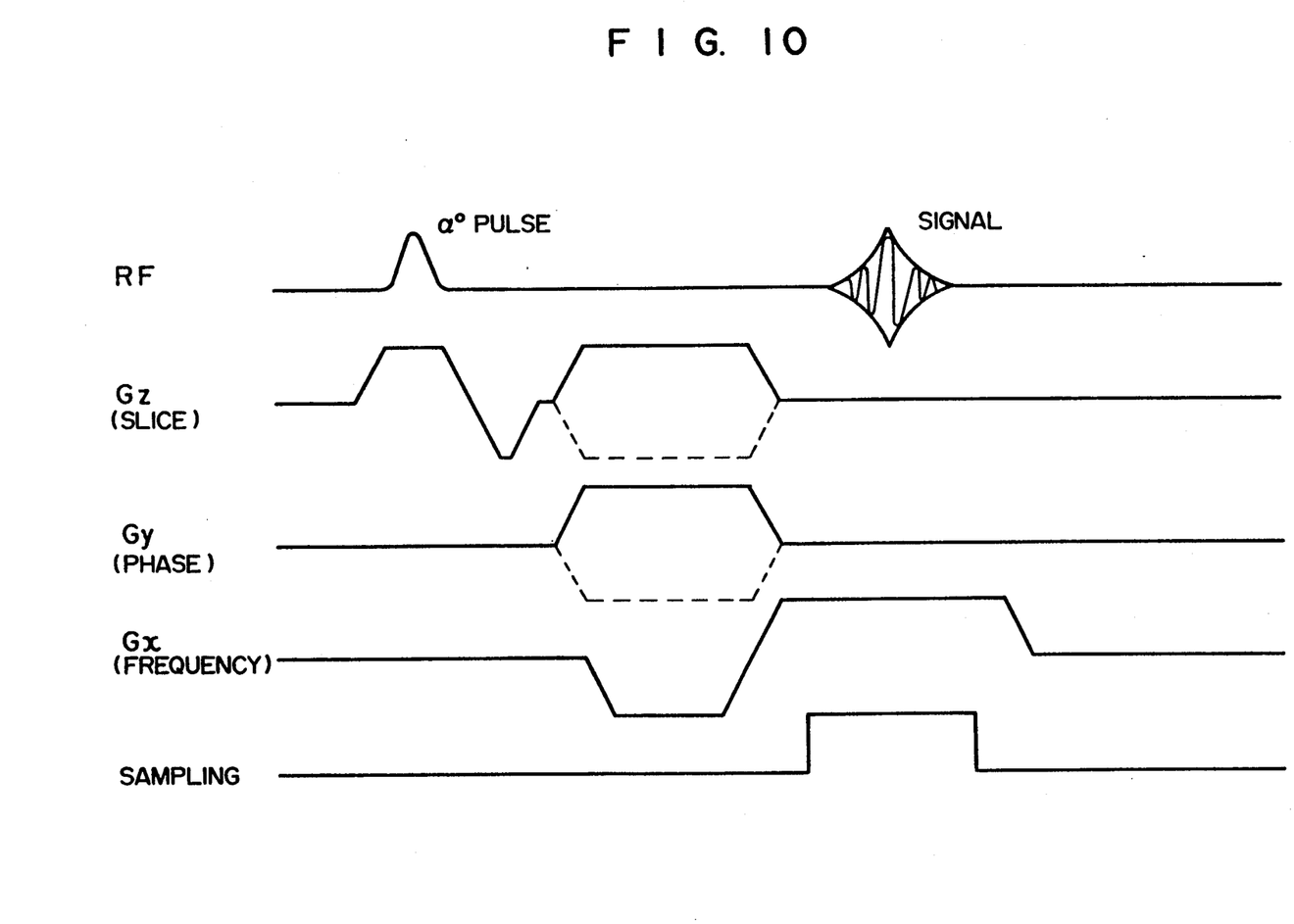
FIG. 10 shows a pulse sequence used in a three-dimensional Fourier transformation imaging method.

FIG. 10 shows a pulse sequence used in a three-dimensional Fourier transformation imaging method. The pulse sequence in the three-dimensional Fourier transformation imaging method is different from the pulse sequence in the two-dimensional Fourier transformation imaging shown in FIG. 7 in that the intensity of a gradient magnetic field $G_Z$ in the z-direction is successively changed for each measuring of a signal so that image data at a position changed in the z-direction is measured at the same time.

Figure 11:
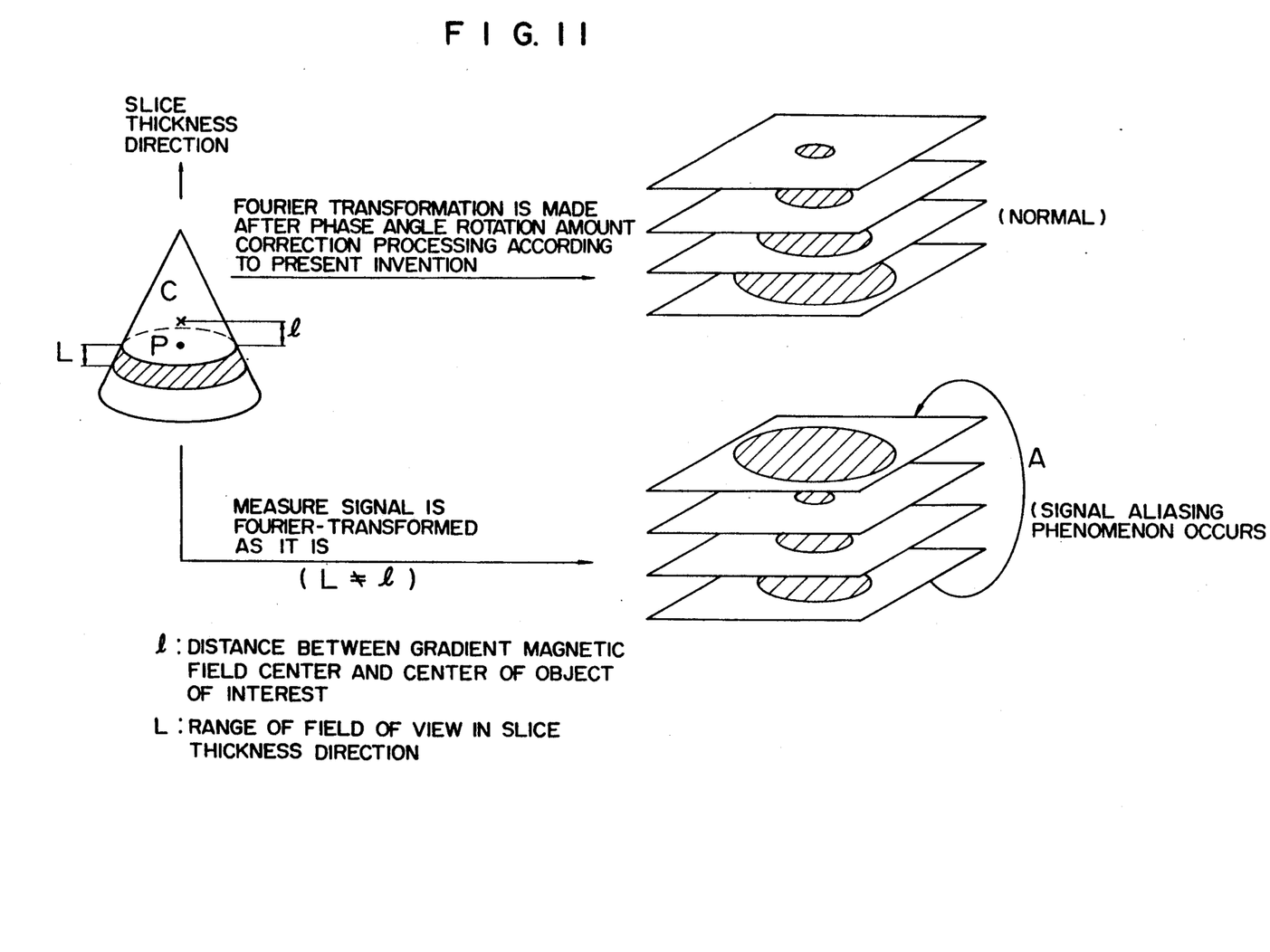
FIG. 11 shows an example in the three-dimensional Fourier transformation imaging method to which the present invention is applied.

FIG. 11 shows an example in the three-dimensional Fourier transformation imaging method to which the present invention is applied. In the case where the gradient magnetic field center C and the center P of an object of interest imaged are apart from each other, the aliasing of a signal occurs in the z-direction (or a slice thickness direction), as shown by arrow A, if a measured signal is Fourier-transformed as it is. But, when a distance ( between the gradient magnetic field center and the center of the object of interest is equal to integral multiple of the range L of a field of view in the slice thickness direction, no aliasing phenomenon occurs. In the present invention, a measured signal is subjected to a processing of correction for the amount of rotation of the phase angle in the z-direction so that the Fourier transformation of such a signal provides normal image data. A flow chart in this case additionally includes calculating the amount $l_z$ of shift to be made in the slice thickness direction in step 104 shown in FIG. 9.

Explanation will be made of an equation showing the phase angle rotation amount correction processing. Like the equation (1), an equation used for the phase angle rotation amount correction processing is as follows:

$$\left. \begin{array}{l} l'_x = (l_x/M) \cdot N \\ l'_y = (l_y/M) \cdot N \\ l'_z = (l_z/M) \cdot N \end{array} \right\} \quad (5)$$

where M and N are the same as those in the equation (1). A measured signal $S(k, m, w)$ is subjected to the phase angle rotation amount correction processing represented by the following equation (6):

$$S'(k, m, w) = S(k, m, w) \cdot e^{2\pi j \frac{k}{N} l_x} \cdot e^{2\pi j \frac{m}{N} l_y} \cdot e^{2\pi j \frac{w}{N} l_z} \quad (6)$$

A three-dimensional Fourier transformation is made for $S'(k, m, w)$ to obtain an image area after shifting. A three-dimensional discrete Fourier transformation of the measured signal $S(k, m, w)$ is represented by the following equation:

$$F_N(x, y, z) = \sum_{k=1}^{N} \sum_{m=1}^{N} \sum_{w=1}^{N} S(k, m, w) \cdot e^{-2\pi j(\frac{kx}{N} + \frac{my}{N} + \frac{wz}{N})} \quad (7)$$

From the equations (6) and (7), a three-dimensional discrete Fourier transformation of $S'(k, m, w)$ is represented by the equation:

$$\sum_{k=1}^{N} \sum_{m=1}^{N} \sum_{w=1}^{N} S'(k, m, w) \cdot e^{-2\pi j(\frac{kx}{N} + \frac{my}{N} + \frac{wz}{N})} = \quad (8)$$

$$\sum_{k=1}^{N} \sum_{m=1}^{N} \sum_{w=1}^{N} S(k, m, w) \cdot e^{2\pi j(\frac{k}{N} l_x + \frac{m}{N} l_y + \frac{w}{N} l_z)} \times$$

$$e^{-2\pi j(\frac{kx}{N} + \frac{my}{N} + \frac{wz}{N})} =$$

$$\sum_{k=1}^{N} \sum_{m=1}^{N} \sum_{w=1}^{N} S(k, m, w) \cdot$$

$$e^{-2\pi j\{\frac{k(x-l_x)}{N} + \frac{m(y-l_y)}{N} + \frac{w(z-l_z)}{N}\}} =$$

$$F_N(x - l_x, y - l_y, z - l_z)$$

The equation (8) shows that the Fourier transformation of the measured signal subjected to the phase angle rotation amount correction processing in accordance with the present invention results in image data after shifting. In the case where the shifting in only the slice thickness direction is made, $l'_x$ and $l'_y$ are equal to 0.

In the present invention, there may be also a method in which a Fourier transformation in a direction other than the shift direction is first made and a Fourier transformation in the shift direction is made after a processing of correction for the amount of rotation of the phase angle has been performed.

We claim:

1. A fourier transformation imaging method comprising:

(a) a step of applying an RF pulse and three-dimensional orthogonal gradient magnetic fields in a slice thickness direction, a phase encoding direction and a frequency encoding direction to an object to be examined in a static magnetic field and measuring a level and phase of a first nuclear magnetic resonance signal generated in said object;

(b) a step of Fourier-transforming said first nuclear magnetic resonance signal to display a first image;

(c) a step of designating on said first image a center of a portion of interest of said object to be examined and a range of a field of view for re-imaging;

(d) a step of measuring a second nuclear magnetic resonance signal level and phase generated in said object by applying the RF pulse and three-dimensional orthogonal gradient magnetic fields in the slice thickness direction, the phase encoding direction and the frequency encoding direction to said object to be examined in the static magnetic field;

(e) a step of determining on said first image a distance between the center of said portion of interest and a center of said first image;

(f) a step of converting said distance into a value calculated in terms of the amount of rotation of a phase angle of the second nuclear magnetic resonance signal;

(g) a step of correcting the amount of rotation of the phase angle of said second nuclear magnetic resonance signal on the basis of the value obtained by the conversion in said step (f), thereby obtaining a corrected signal in which said distance is zero; and (h) a step of Fourier-transforming said corrected signal to display a second image.

2. A Fourier transformation imaging method according to claim 1, wherein said distance determining step (e) includes determining said distance as an amount of deviation in said phase encoding direction and an amount of deviation in said frequency encoding direction.

3. A Fourier transformation imaging method according to claim 2, wherein said distance determining step (e) includes the step of determining a distance $l_x$ of shift to be made in said frequency encoding direction and a distance $l_y$ of shift to be made in said phase encoding direction on said first image; said converting step (f) includes the step of calculating values $l'_x$ and $l'_y$ which are used for a processing of correction for the amount of rotation of the phase angle and are represented by the equations $$l'_x = (l_x/M) \cdot N$$

$$l'_y = (l_y/M) \cdot N$$

where M is a field of view in units of length for an image after shifting obtained by re-imaging and N is the number of Fourier transformation points of said image after shifting in said frequency encoding direction or said phase encoding direction; and said correcting step (g) includes the step of subjecting a measured signal S(k, m) to the phase angle rotation amount correction processing represented by the equation $$S'(k, m) = S(k, m) \cdot e^{2\pi j \frac{k}{N} l'_x} \cdot e^{2\pi j \frac{m}{N} l'_y}$$

where $\pi$ is the ratio of the circumference of a circle to its diameter and $j^2$ is equal to $-1$.

4. A Fourier-transformation imaging method comprising:

(a) a step of applying an RF pulse and three-dimensional orthogonal gradient magnetic fields in a slice thickness direction, a phase encoding direction and a frequency encoding direction to an object to be examined in a static magnetic field and measuring a first nuclear magnetic resonance signal level and phase generated in said object;

(b) a step of Fourier-transforming said first nuclear magnetic resonance signal to display a first image;

(c) a step of designating on said first image a slice position of a portion of interest of said object to be examined, a center of said object of interest and a range of a field of view for re-imaging;

(d) a step of measuring a second nuclear magnetic resonance signal level and phase generated in said object by applying the RF pulse and three-dimensional orthogonal gradient magnetic fields in the slice thickness direction, the phase encoding direction and the frequency encoding direction to the object to be examined in the static magnetic field;

(e) a step of determining on said first image an amount of change in said slice position and a distance between the center of said object of interest and the center of said first image;

(f) a step of converting each of said amount of change in slice position and said distance into a value calculated in terms of the amount of rotation of a phase angle of the second nuclear magnetic resonance signal;

(g) a step of correcting the amount of rotation of the phase angle of said second nuclear magnetic resonance signal on the basis of the values obtained by the conversion in said step (f) so that a corrected signal in which said distance is zero is obtained with data at a new slice position; and (h) a step of Fourier-transforming said corrected signal to display a second image.

5. A Fourier transformation imaging method according to claim 4, wherein said distance determining step (e) includes determining said distance as an amount of deviation in said phase encoding direction and an amount of deviation in said frequency encoding direction.

6. A Fourier transformation imaging method according to claim 5, wherein said distance determining step (e) includes the step of determining a distance $l_x$ of shift to be made in said frequency encoding direction, a distance $l_y$ of shift to be made in said phase encoding direction and a distance $l_z$ in the slice thickness direction on said first image;

said converting step (f) includes the step of calculating values $l'_x$, $l'_y$ and $l'_z$ which are used for a processing of correction for the amount of rotation of the phase angle and are represented by the equations $$l'_x = (l_x/M) \cdot N$$

$$l'_y = (l_y/M) \cdot N$$

$$l'_z = (l_z/M) \cdot N$$

where M is a field of view in units of length for an image after shifting obtained by re-imaging and N is the number of Fourier transformation points of said image after shifting in said frequency encoding direction or said phase encoding direction; and
said correction step (g) includes the step of subjecting a measured signal S(k, m, w) to the phase angle rotation amount correction processing represented by the equation $$S'(k, m, w) = S(k, m, w) \cdot e^{2\pi j \frac{k}{N} lx} \cdot e^{2\pi j \frac{m}{N} ly} \cdot e^{2\pi j \frac{w}{N} lz}$$

where $\pi$ is the ratio of the circumference of a circle to its diameter and $j^2$ is equal to $-1$.

7. A Fourier transformation imaging method comprising:
   (a) a step of exciting nuclei spins in an object to be examined which is disposed in a uniform magnetic field, which is generated by one of a permanent magnet, resistive magnet and superconducting magnet, by applying a gradient magnetic field to said object to determine a slice plane of said object and by applying a high frequency magnetic field corresponding to a frequency of a Larmor precession;
   (b) a step of measuring a level and phase of a first nuclear magnetic resonance signal of a frequency of said Larmor precession corresponding to a strength of the magnetic field in which said nuclei spins are disposed by applying gradient magnetic fields in a phase encoding direction and in a frequency encoding direction which are perpendicular to each other and which are parallel to said slice plane;
   (c) a step of Fourier-transforming said first nuclear magnetic resonance signal to display a first image;
   (d) a step of designating on said first image a center of a portion of interest of said object to be examined and a range of a field of view for re-imaging;
   (e) a step of measuring a second nuclear magnetic resonance signal level and phase generated in said object by applying the RF pulse and three-dimensional orthogonal gradient magnetic fields in the slice thickness direction, the phase encoding direction and the frequency encoding direction to said object to be examined in the static magnetic field;
   (f) a step of determining on said first image a distance between the center of said portion of interest and a center of said first image;
   (g) a step of converting said distance into a value calculated in terms of the amount of rotation of a phase angle of the second nuclear magnetic resonance signal;
   (h) a step of correcting the amount of rotation of the phase angle of said second nuclear magnetic resonance signal on the basis of the value obtained by the conversion in said step (g), thereby obtaining a corrected signal in which said distance is zero; and
   (i) a step of Fourier-transforming said corrected signal to display a second image.

* * * * *